(12) United States Patent
Zhang et al.

(10) Patent No.: US 10,764,693 B2
(45) Date of Patent: Sep. 1, 2020

(54) MICROPHONE AND MANUFACTURING METHOD THEREFOR

(71) Applicants: Semiconductor Manufacturing International (Shanghai) Corporation, Shanghai (CN); Semiconductor Manufacturing International (Beijing) Corporation, Beijing (CN)

(72) Inventors: Jian Zhang, Shanghai (CN); Xin Ming Lv, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 16/044,786

(22) Filed: Jul. 25, 2018

(65) Prior Publication Data
US 2019/0069094 A1 Feb. 28, 2019

(30) Foreign Application Priority Data
Aug. 28, 2017 (CN) .......................... 2017 1 0748925

(51) Int. Cl.
*H04R 1/08* (2006.01)
*H04R 19/04* (2006.01)
(Continued)

(52) U.S. Cl.
CPC .......... *H04R 19/04* (2013.01); *B81C 1/00166* (2013.01); *B81B 2201/0257* (2013.01);
(Continued)

(58) Field of Classification Search
CPC .......... H04R 19/04; H04R 3/005; H04R 3/00; H04R 19/005; H04R 7/20
See application file for complete search history.

(56) References Cited

U.S. PATENT DOCUMENTS

| | | | |
|---|---|---|---|
| 2007/0201710 A1* | 8/2007 | Suzuki | B81B 3/0072 381/174 |
| 2008/0232615 A1* | 9/2008 | Song | H04R 19/005 381/174 |

(Continued)

FOREIGN PATENT DOCUMENTS

| | | |
|---|---|---|
| CN | 101427591 A | 5/2009 |
| CN | 101692455 A | 4/2010 |

(Continued)

*Primary Examiner* — Amir H Etesam
(74) *Attorney, Agent, or Firm* — Brinks Gilson & Lione

(57) ABSTRACT

The present application teaches microphones and manufacturing methods therefor and relates to the field of semiconductor technologies. In some implementations, a method may include: providing a substrate structure, the substrate structure including a substrate and a first insulating layer covering a first part of the substrate; forming a first electrode plate layer, the first electrode plate layer covering a part of the first insulating layer; and forming a second insulating layer, the second insulating layer covering a part of a region of the first insulating layer which is not covered by the first electrode plate layer and a part of the first electrode plate layer, where when seen from the top, the first electrode plate layer and the second insulating layer form an angle, the angle exposes a second part of the substrate, and a degree θ of the angle is larger than or equal to 90° and is smaller than or equal to 180°. The present application can improve a problem of unexpected holes formed in the microphone.

12 Claims, 10 Drawing Sheets

(51) Int. Cl.
*B81C 1/00* (2006.01)
*H04R 19/00* (2006.01)
*H04R 31/00* (2006.01)

(52) U.S. Cl.
CPC ........... *B81B 2203/0315* (2013.01); *B81B 2203/0353* (2013.01); *B81B 2203/04* (2013.01); *H04R 19/005* (2013.01); *H04R 31/00* (2013.01); *H04R 2201/003* (2013.01)

(56) References Cited

U.S. PATENT DOCUMENTS

2013/0094675 A1* 4/2013 Je ........................... H04R 1/00
 381/174
2015/0341726 A1 11/2015 Friza

FOREIGN PATENT DOCUMENTS

| CN | 102760690 A | 10/2012 |
| CN | 104066041 A | 9/2014 |

\* cited by examiner

MICROPHONE AND MANUFACTURING METHOD THEREFOR

RELATED APPLICATIONS

The present application claims priority to Chinese Patent Appln. No. 201710748925.8, filed on Aug. 28, 2017, the entire disclosure of which is hereby incorporated by reference.

BACKGROUND

Technical Field

The present application relates to the field of semiconductor technologies, and in particular, to microphones and a manufacturing methods therefor. More specifically, the present application relates to a Micro Electro-Mechanical Systems (MEMS) microphone and a manufacturing method therefor.

Related Art

FIG. 1A and FIG. 1B are sectional schematic views of different stages of an existing method for manufacturing a microphone.

First, as shown in FIG. 1A, a substrate structure is provided. The substrate structure includes a substrate 101, a first insulating layer 102 on the substrate 101, a first electrode plate layer 103 on the first insulating layer 102, a second insulating layer 104 on the first electrode plate layer 103, a second electrode plate layer 105 on the second insulating layer 104, and a supporting layer 106 on the second electrode plate layer 105. The second electrode plate layer 105 and the supporting layer 106 have a through hole 107 extending to the second insulating layer 104. A through hole 108 exposing the first insulating layer 102 is formed on the bottom of the substrate 101.

Then, as shown in FIG. 1B, a part of the first insulating layer 102 and a part of the second insulating layer 104 are removed by wet-etching, so as to form a cavity 109 between the first electrode plate layer 103 and the second electrode plate layer 105.

In the wet-etching process, there is no need to remove all of the first insulating layer 102 and the second insulating layer 104, and the first insulating layer 102 and the second insulating layer 104 at some positions need to be preserved. For example, the second insulating layer 104 and the first insulating layer 102 are provided below the supporting layer 106 in some regions, the first electrode plate layer 103 and the first insulating layer 102 are provided below the supporting layer 106 in some regions, and the first insulating layer 102 and the second insulating layer 104 in these regions need to be reserved (not shown in the figure).

However, the inventors of this application find that: after the wet-etching process, the first insulating layer 102 and the second insulating layer 104 below the supporting layer 106 that were preserved may be removed or partially removed, and as a result, unexpected holes are formed below the supporting layer 106, thereby affecting performances of the microphone.

SUMMARY

An object of the present application is to improve a problem of unexpected holes formed in the microphone.

In one aspect of the present disclosure, a method for manufacturing a microphone is provided. The method may include: providing a substrate structure, the substrate structure including a substrate and a first insulating layer covering a first part of the substrate; forming a first electrode plate layer, the first electrode plate layer covering a part of the first insulating layer; and forming a second insulating layer, the second insulating layer covering a part of a region of the first insulating layer which is not covered by the first electrode plate layer and a part of the first electrode plate layer, where when seen from the top, the first electrode plate layer and the second insulating layer form an angle, the angle exposes a second part of the substrate, and a degree $\theta$ of the angle is larger than or equal to 90° and is smaller than or equal to 180°.

In some implementations, $\theta$ is larger than 90° and is smaller than or equal to 180°.

In some implementations, forming a first electrode plate layer includes: depositing a first electrode plate material layer on the substrate structure; forming a first patterned mask layer on the first electrode plate material layer; and etching the first electrode plate material layer using the first mask layer as a mask, where the residual first electrode plate material layer serves as the first electrode plate layer.

In some implementations, forming a second insulating layer includes: depositing a second insulating material layer on the substrate structure on which the first electrode plate layer has been formed; forming a second patterned mask layer on the second insulating material layer; and etching the second insulating material layer using the second mask layer as a mask, where the residual second insulating material layer serves as the second insulating layer.

In some implementations, the method further includes: forming a second electrode plate layer on the second insulating layer; and depositing a supporting layer, the supporting layer covering the substrate structure on which the second electrode plate layer has been formed.

In some implementations, the method further includes: forming a first through hole penetrating the supporting layer and the second electrode plate layer and forming a second through hole penetrating the substrate; and removing a part of the first insulating layer and a part of the second insulating layer by wet-etching, so as to form a cavity between the first electrode plate layer and the second electrode plate layer.

In some implementations, materials of the first electrode plate layer and the second electrode plate layer include polycrystalline silicon; materials of the first insulating layer and the second insulating layer include silicon oxides; and a material of the supporting layer includes silicon nitrides.

In another aspect of the present application, a microphone is provided. The microphone may include: a substrate structure and a supporting layer covering the substrate structure, where the substrate structure includes: a substrate defining a through hole penetrating the substrate; a first insulating layer covering a first part of the substrate; a first electrode plate layer covering the through hole and a part of the first insulating layer; a second insulating layer covering a part of a region of the first insulating layer which is not covered by the first electrode plate layer, where when seen from the top, the first electrode plate layer and the second insulating layer form an angle, the angle exposes a second part of the substrate, and a degree $\theta$ of the angle is larger than or equal to 90° and is smaller than or equal to 180°; and a second electrode plate layer located above the first electrode plate layer.

In some implementations, $\theta$ is larger than 90° and is smaller than or equal to 180°.

In some implementations, materials of the first electrode plate layer and the second electrode plate layer include polycrystalline silicon; materials of the first insulating layer and the second insulating layer include silicon oxides; and a material of the supporting layer includes silicon nitrides.

In yet another aspect of present disclosure, another method for manufacturing a microphone is provided. The method may include: providing a substrate structure, the substrate structure including a substrate and a first insulating layer covering a part of the substrate; forming a first electrode plate layer, the first electrode plate layer covering a first part of the first insulating layer; and forming a second insulating layer, the second insulating layer covering a part of a region of the first insulating layer which is not covered by the first electrode plate layer and a part of the first electrode plate layer, where when seen from the top, the first electrode plate layer and the second insulating layer form an angle, the angle exposes a second part of the first insulating layer, and a degree θ of the angle is larger than or equal to 90° and is smaller than or equal to 180°.

In yet another aspect of the present disclosure, another microphone is provided. The microphone may include: a substrate structure and a supporting layer covering the substrate structure, where the substrate structure includes: a substrate defining a through hole penetrating the substrate; a first insulating layer covering a part of the substrate; a first electrode plate layer covering the through hole and a first part of the first insulating layer; a second insulating layer, covering a part of a region of the first insulating layer which is not covered by the first electrode plate layer, where when seen from the top, the first electrode plate layer and the second insulating layer form an angle, the angle exposes a second part of the first insulating layer, and a degree θ of the angle is larger than or equal to 90° and is smaller than or equal to 180°; and a second electrode plate layer, located above the first electrode plate layer.

In implementations of the present disclosure, a degree of the angle formed by the first electrode plate layer and the second insulating layer is larger than or equal to 90° and is smaller than or equal to 180°. Therefore, after the supporting layer is subsequently formed, a filling effect of the supporting layer in the region of the angle can be improved, weak points of the supporting layer can be reduced or eliminated, and further, the problem of holes generated in the microphone can be improved or eliminated.

The other features, aspects and advantages of this application will become clear according to the detailed description of exemplary embodiments and implementations of this disclosure with reference to the accompanying drawings.

BRIEF DESCRIPTION OF THE DRAWINGS

The figures forming a part of the specification illustrate exemplary embodiments and implementations of the present disclosure and are used to explain the principles of the present disclosure along with the specification.

DETAILED DESCRIPTION

Various exemplary embodiments and implementations of the present disclosure will be described in detail with reference to the accompanying drawings. It should be understood that unless otherwise specifically described, relative arrangements, numeral expressions, and values of parts and steps stated in these embodiments and implementations should not be understand as limitation to the scope of this application.

In addition, it should be understood that for ease of description, the sizes of respective parts shown in the accompanying drawings are not necessarily drawn according to an actual proportional relation. For example, the thickness or width of some layers can be magnified relative to other layers.

The following descriptions for exemplary embodiments and implementations of the present disclosure are merely illustrative rather than limiting.

Technologies, methods and devices known to a person of ordinary skill in the art may not be described in detail, but in cases in which these technologies, methods, and devices are applicable, the technologies, methods and devices should be regarded as a part of the description.

It should be noted that similar marks and letters represent similar items in the following accompanying drawings. Therefore, once an item is defined or described in an accompanying drawing, the item does not need to be further discussed in subsequent accompanying drawings.

Figure 1A:
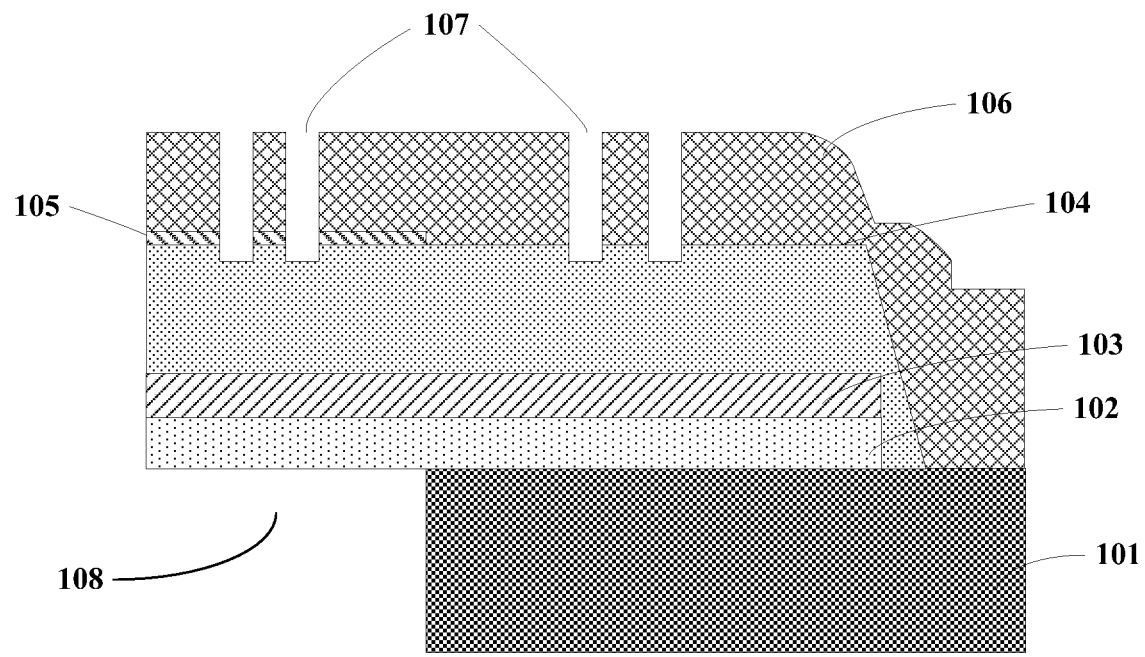
FIG. 1A and FIG. 1B are sectional schematic views of different stages of a method for manufacturing a microphone.
Figure 1B:
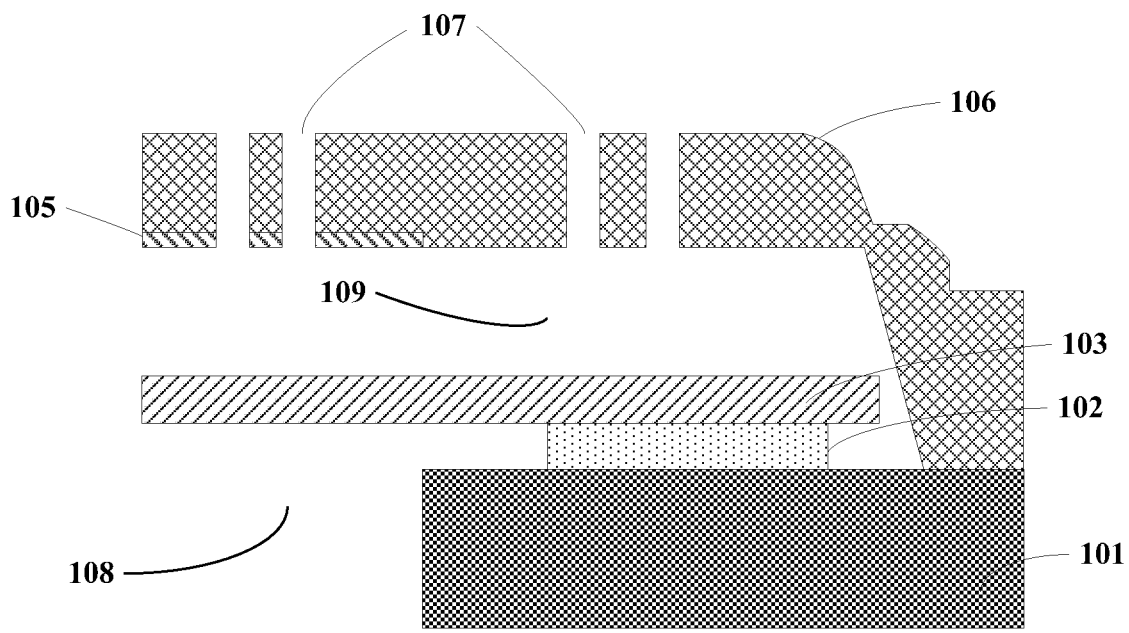
Figure 2:
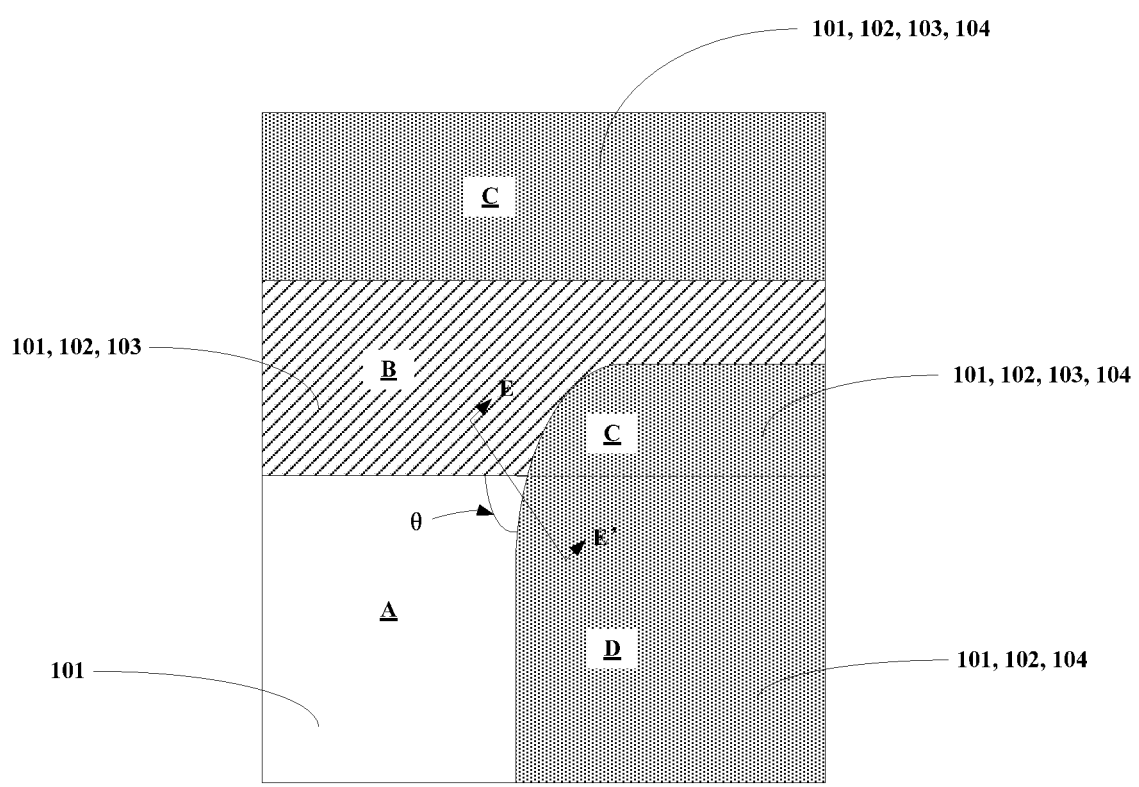
FIG. 2 is a top view of a microphone after a second insulating layer is formed.

FIG. 2 is a top view of an existing microphone after a second insulating layer is formed.

In FIG. 2, a region A is an exposed substrate 101. A region B sequentially includes the substrate 101, a first insulating layer 102, and a first electrode plate layer 103 from bottom to top. A region C sequentially includes the substrate 101, the first insulating layer 102, the first electrode plate layer 103, and a second insulating layer 104 from bottom to top. A region D sequentially includes the substrate 101, the first insulating layer 102, and the second insulating layer 104 from bottom to top.

After a supporting layer 106 is deposited in the region shown in FIG. 2, wet-etching is performed. In the wet-etching process, the first insulating layer 102 in the region B and the first insulating layer 102 and the second insulating layer 104 in the region D are not expected to be removed.

As stated above, after the wet-etching process, the first insulating layer 102 in the region B and the first insulating layer 102 and the second insulating layer 104 in the region D are not expected to be removed or partially removed. As a result, unexpected holes are formed in the region B and the region D below the supporting layer 106.

After examining why the first insulating layer 102 in the region B and the first insulating layer 102 and the second insulating layer 104 in the region D are removed, the inventors determined that after slicing these regions (along an E-E' direction) using a Focused Ion Beam (FIB) that the surface of the supporting layer 106 of the region A is uneven and has weak points. These weak points may be easily corroded by an etching agent during the wet-etching. As a result, a passage penetrating the supporting layer 106 is formed toward a lower part of the supporting layer 106 along the weak points, and the etching agent will flow to the substrate 101 of the region A along the passage, and further flows to the region B and the region D. Consequently, the first insulating layer 102 in the region B is corroded, and the first insulating layer 102 and the second insulating layer 104 in the region D are corroded, thereby leading to generation of holes in the region B and region D.

In examining why the surface of the supporting layer 106 of the region A has the weak points, it was further determined that quantities of layers included in four regions A, B, C, and D are different, that is, the four regions have different heights, and steps are formed. Besides, a degree θ of an angle (the position at which the arrow points) formed by a morphology of the first electrode plate layer 103 (including three regions B, C, and D) and the morphology of the second insulating layer 104 (including two regions C and D) is an acute angle. Therefore, after the supporting layer 106 is deposited in the region shown in FIG. 2, the weak points are easily formed in the acute angle of the supporting layer 106.

The inventors provide the following solution to address these issues.

Figure 3:
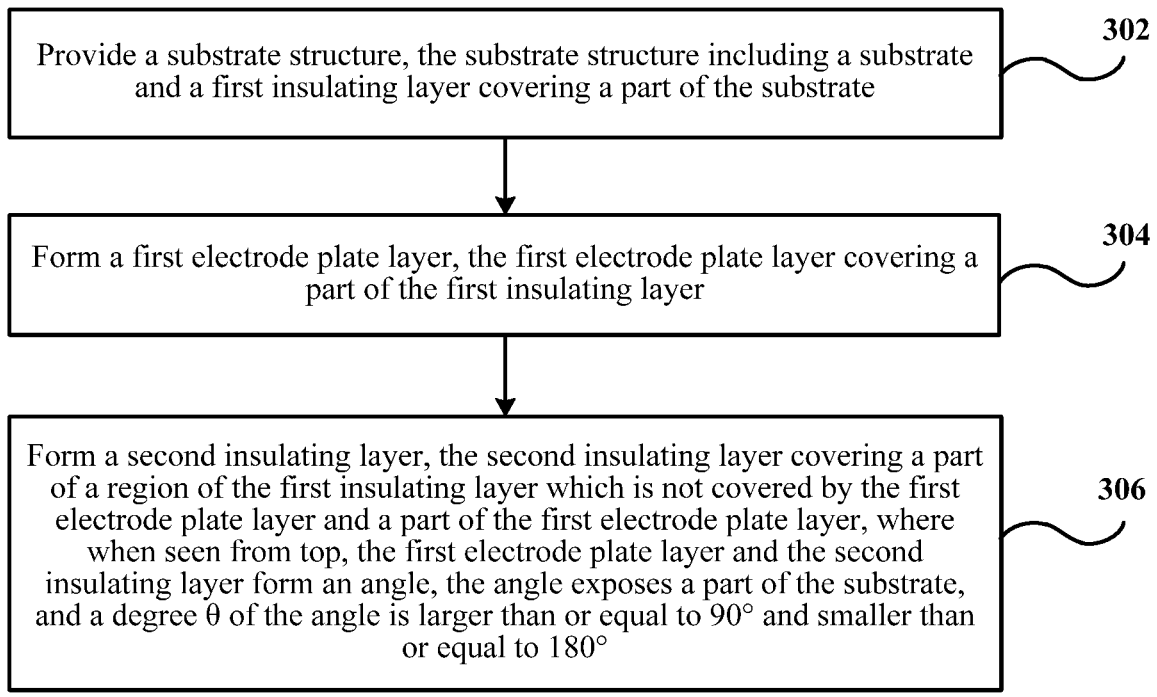
FIG. 3 is a schematic flowchart of a method for manufacturing a microphone according to one form of the present disclosure.
Figure 4A:
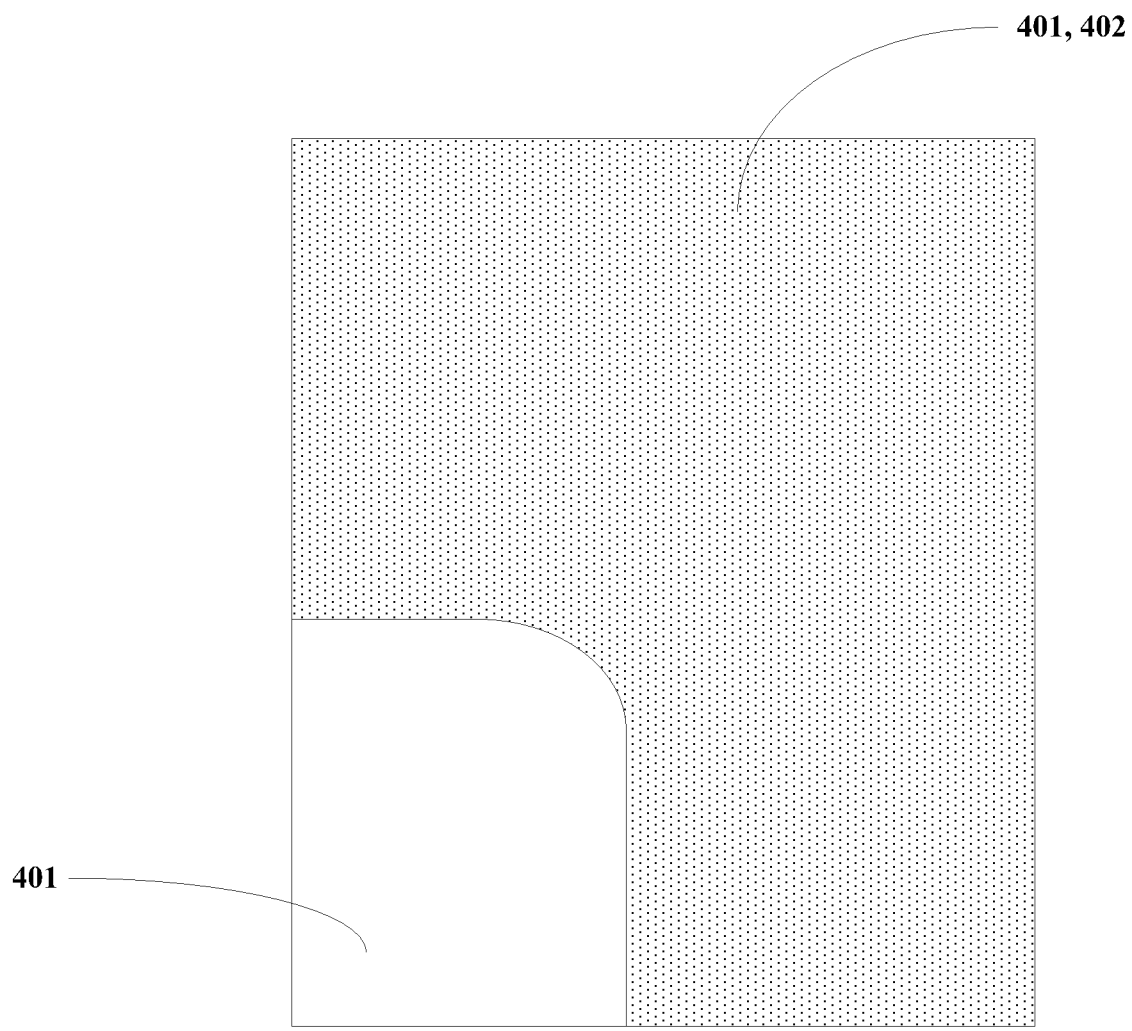
FIG. 4A to FIG. 4C are top views of different stages of a method for manufacturing a microphone according to one form of the present disclosure.
Figure 4B:
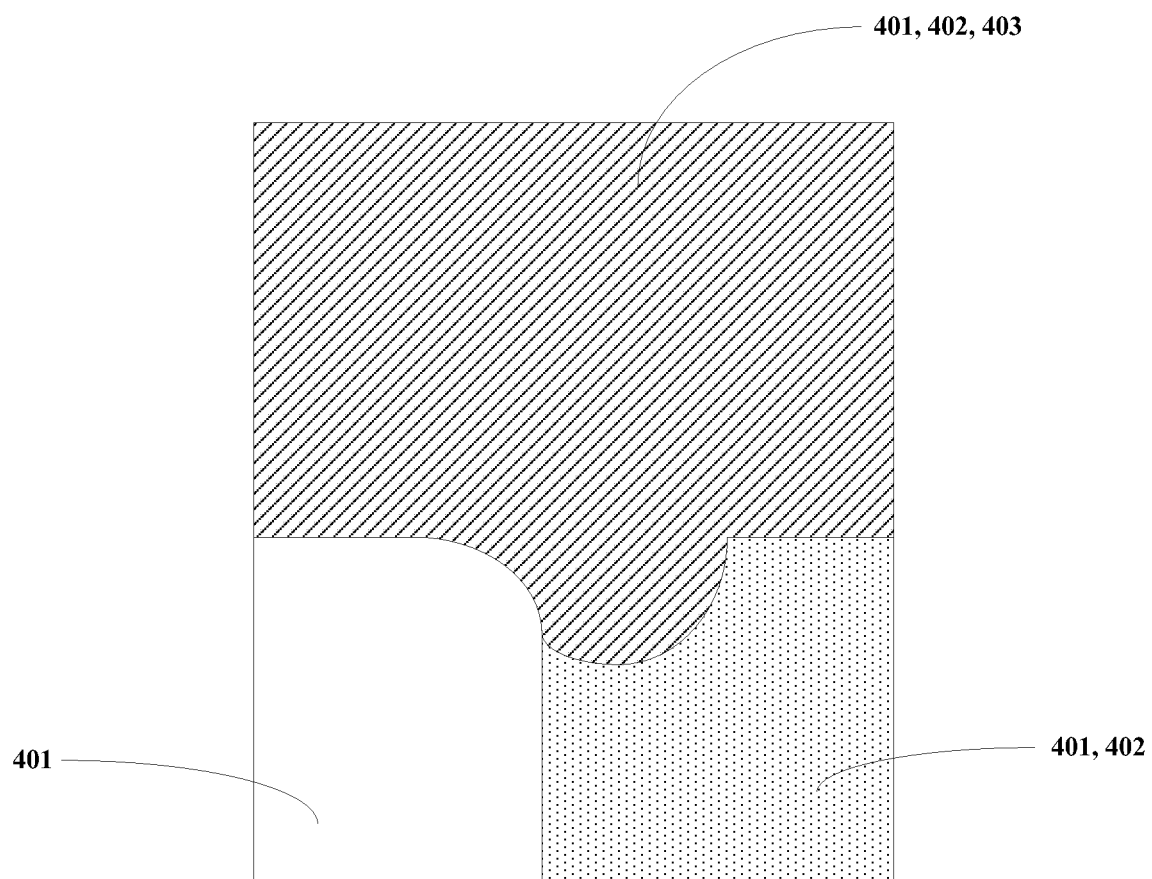
Figure 4C:
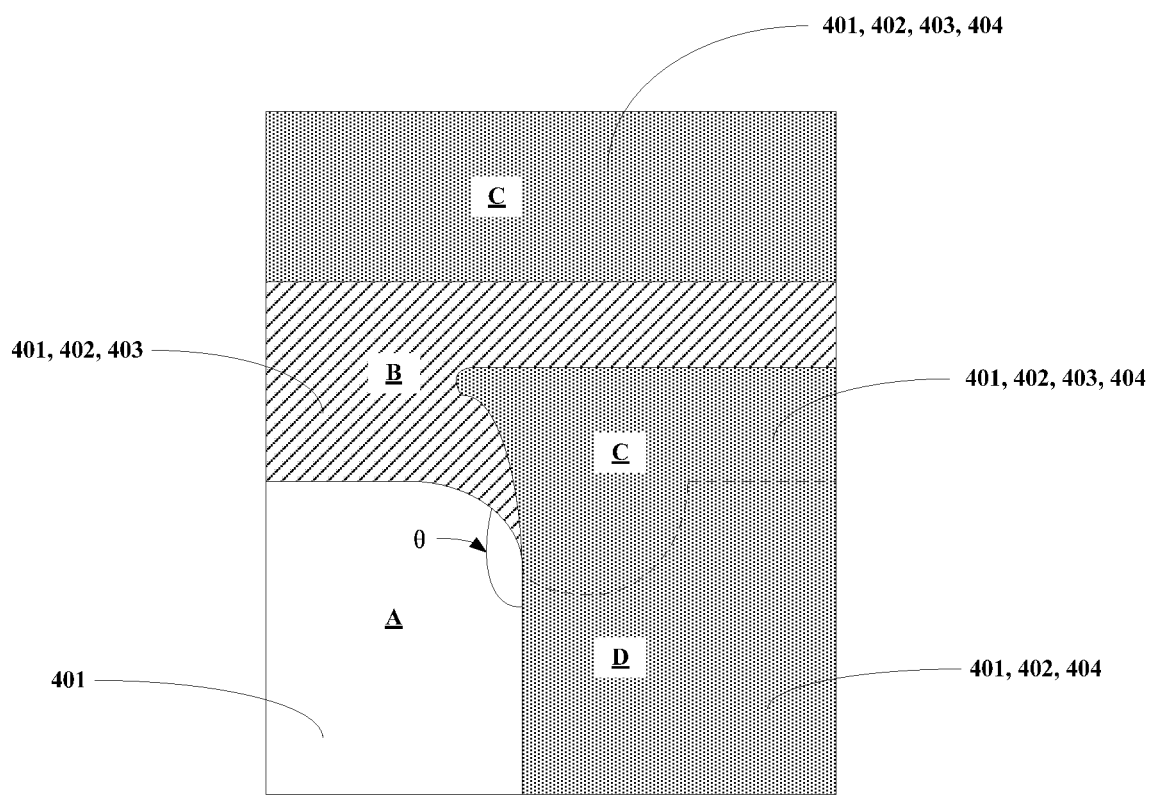

FIG. 3 is a schematic flowchart of a method for manufacturing a microphone according to one form of the present disclosure. FIG. 4A to FIG. 4C are top views of different stages of a method for manufacturing a microphone according to one forms of the present disclosure.

As shown in FIG. 3, first, step 302: Provide a substrate structure.

As shown in FIG. 4A, the substrate structure includes a substrate 401 and a first insulating layer 402 covering a part of the substrate 401, where a part of the substrate 401 is exposed. The substrate 401, for example, may be a silicon substrate, a semiconductor substrate of an element such as germanium, a semiconductor substrate of a compound such as gallium arsenide, or the like. The first insulating layer 402, for example, may be silicon oxides and the like.

Next, step 304: Form a first electrode plate layer 403.

As shown in FIG. 4B, the first electrode plate layer 403 covers a part of the first insulating layer 402, and a part of the first insulating layer 402 is exposed. In some implementations, a material of the first electrode plate layer 403 may be polycrystalline silicon. Here, the morphology of a border, close to the exposed substrate 401, of the first electrode plate layer 403 overlaps with the morphology of a border, close to the exposed substrate 401, of the first insulating layer 402, or the morphology of a border, close to the exposed substrate 401, of the first electrode plate layer 403 covers the morphology of a border, close to the exposed substrate 401, of the first insulating layer 402. That is, when seen from top, the first electrode plate layer 403 is adjacent to the exposed substrate 401.

In some implementations, the first electrode plate layer 403 may be formed in the following manner: first, depositing a first electrode plate material layer, for example, polycrystalline silicon, on the substrate structure shown in FIG. 4A; then forming a first patterned mask layer, for example, a photoinduced anti-etching agent, on the first electrode plate material layer; and afterwards, etching the first electrode plate material layer by using the first mask layer as a mask, the residual first electrode plate material layer serving as the first electrode plate layer 403.

Then, step 306: Form a second insulating layer 404. The first insulating layer 402, for example, may be silicon oxides and the like.

As shown in FIG. 4C, the second insulating layer 404 covers a part of a region of the first insulating layer 402 which is not covered by the first electrode plate layer 403 and a part of the first electrode plate layer 402. Here, the morphology of a border, close to the exposed substrate 401, of the second insulating layer 402 overlaps with the morphology of a border, close to the exposed substrate 401, of the first insulating layer 402, or the morphology of a border, close to the exposed substrate 401, of the first electrode plate 403 covers the morphology of a border, close to the exposed substrate 401, of the first insulating layer 402. That is, when seen from top, the second insulating layer 404 is adjacent to the exposed substrate 401.

In some implementations, the second insulating layer 404 may be formed in the following manner: at first, depositing a second insulating material layer, for example, silicon oxides, on the substrate structure on which the first electrode plate layer 403 has been formed; then, forming a second patterned mask layer, for example, a photoinduced anti-etching agent, on the second insulating material layer; and afterwards, etching the second insulating material layer by using the second mask layer as a mask, the residual second insulating material layer serving as the second insulating layer 404.

After the second insulating layer 404 is formed, four adjacent regions A, B, C, and D are formed. The region A is the exposed substrate 401, the region B sequentially includes the substrate 401, the first insulating layer 402, and the first electrode plate layer 403 from bottom to top, the region C sequentially includes the substrate 401, the first insulating layer 402, the first electrode plate layer 403, and the second insulating layer 404 from bottom to top, and the region D sequentially includes the substrate 401, the first insulating layer 402, and the second insulating layer 404 from bottom to top. It should be noted that although FIG. 4C shows two regions C, it is merely illustrative and is not intended to limit a scope of this application.

When seen from top, the first electrode plate layer 403 (including two regions B and C) and the second insulating layer 404 (including two regions C and D) form an angle (the position at which the arrow points), the angle exposes a part of the substrate 401, and a degree θ of the angle is larger than or equal to 90° and smaller than or equal to 180°. Preferably, θ is larger than 90° and smaller than or equal to 180°. In the foregoing range, the lager θ is, the better it is.

To obtain the angle within the foregoing angle range, in some implementations, a mask plate for forming the first electrode plate layer 403 may be changed, and a mask plate that is the same as that for forming the second insulating layer 402 in prior art is used. In other implementations, the mask plate for forming the second insulating layer 402 may be changed, and a mask plate that is the same as that for forming the first electrode plate layer 403 in the prior art is used. In yet other implementations, both a mask plate for forming the first electrode plate layer 403 and a mask plate for forming the second insulating layer 402 may be changed.

The degree of the formed angle is larger than or equal to 90° and is smaller than or equal to 180°. Therefore, after the supporting layer is subsequently formed, a filling effect of the supporting layer in the region of the angle can be improved, the weak points of the supporting layer can be reduced or eliminated, and further, the problem of generation of holes in the region B and the region D can be improved or eliminated.

Figure 5A:
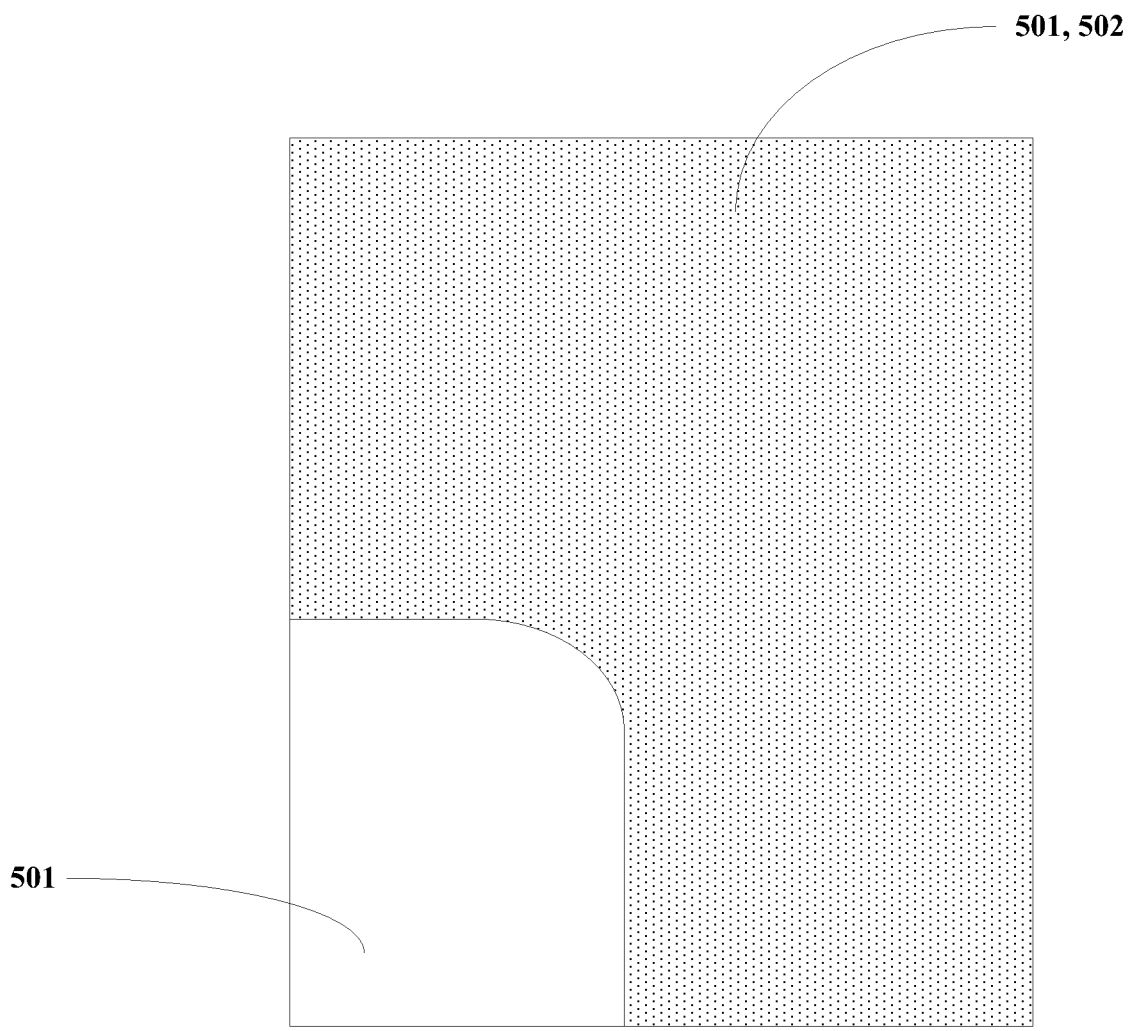
FIG. 5A to FIG. 5C are top views of different stages of a method for manufacturing a microphone according to another form of the present disclosure.
Figure 5B:
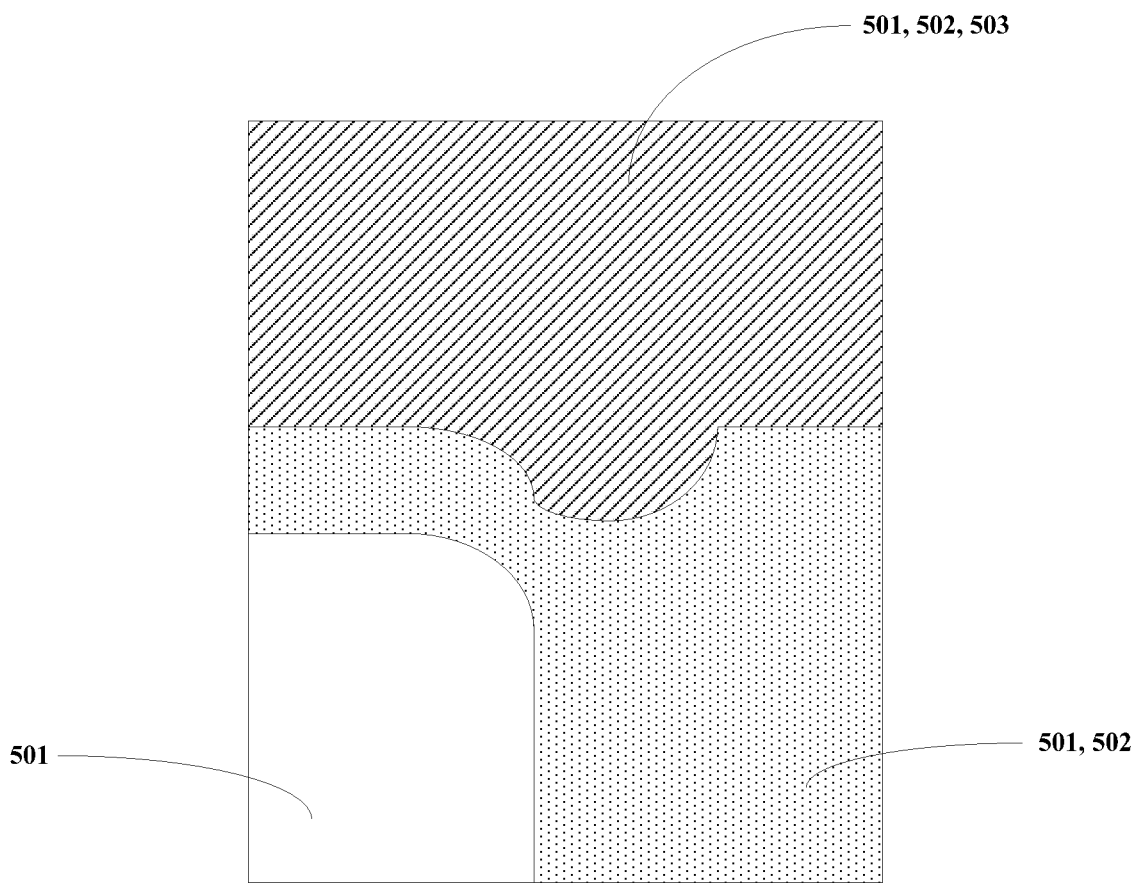
Figure 5C:
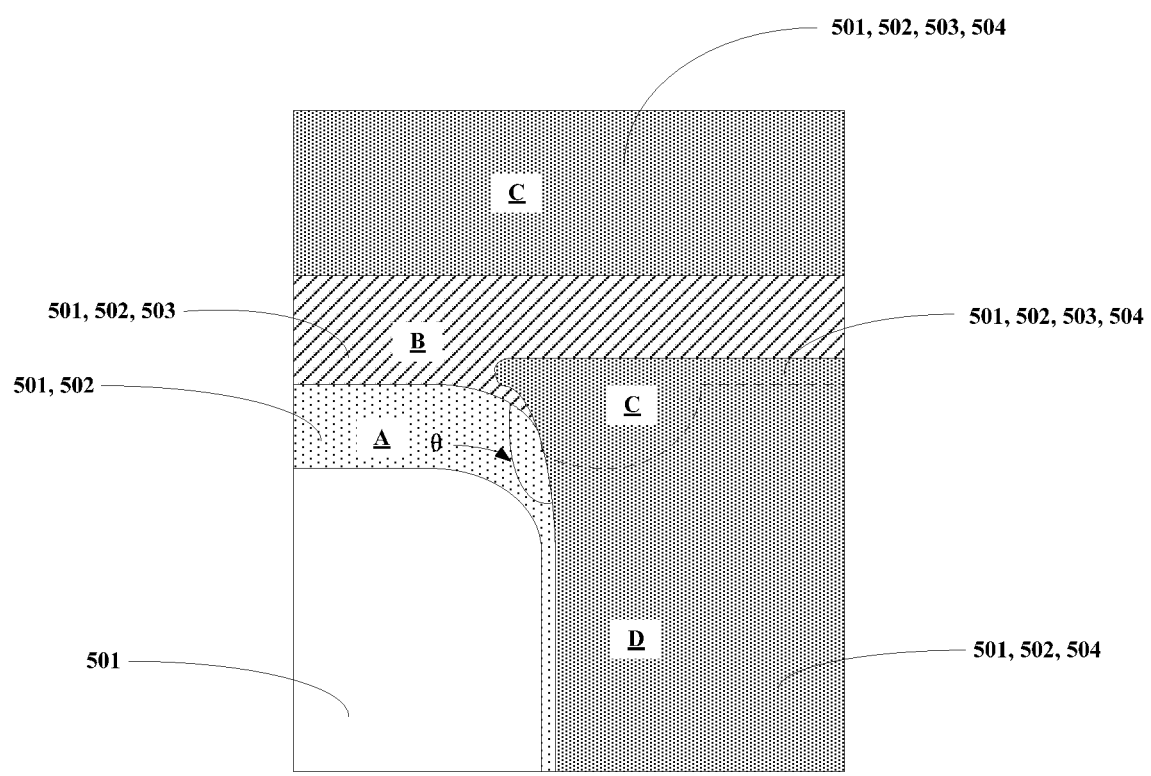

FIG. 5A to FIG. 5C are top views of different stages of a method for manufacturing a microphone according to another form of the present disclosure. In the following descriptions, only differences from among the implementations shown in FIG. 4A to FIG. 4C are described. Refer to the foregoing descriptions for similarities.

As shown in FIG. 5A, a substrate structure is provided. The substrate structure includes a substrate 501 and a first insulating layer 502 covering a part of the substrate 501 such that a part of the substrate 501 is exposed.

As shown in FIG. 5B, a first electrode plate layer 503 is formed. The first electrode plate layer 503 covers a part of the first insulating layer 502, and a part of the first insulating layer 502 is exposed. Here, the morphology of a border, close to the exposed substrate 501, of the first electrode plate layer 503 is not coincided with the morphology of a border, close to the exposed substrate 501, of the first insulating layer 502. That is, when seen from top, the first electrode plate layer 503 is not adjacent to the exposed substrate 501.

As shown in FIG. 5C, a second insulating layer 504 is formed. The second insulating layer 504 covers a part of a region (the region D) of the first insulating layer 502 which is not covered by the first electrode plate layer 503, and a part (the region C) of the first electrode plate layer 502. Here, the morphology of a border, close to the exposed substrate 501, of the second insulating layer 504 is not coincided with the morphology of a border, close to the exposed substrate 501, of the first insulating layer 502. That is, when seen from top, the second insulating layer 504 is not adjacent to the exposed substrate 501.

After the second insulating layer 504 is formed, the four adjacent regions A, B, C, and D are formed similarly. The region A sequentially includes the substrate 501 and the first insulating layer 502 from bottom to top, the region B sequentially includes the substrate 501, the first insulating layer 502 and the first electrode plate layer 503 from bottom to top, the region C sequentially includes the substrate 501, the first insulating layer 502, the first electrode plate layer 503, and the second insulating layer 504 from bottom to top, and the region D sequentially includes the substrate 501, the first insulating layer 502 and the second insulating layer 504 from bottom to top.

When seen from the top, the first electrode plate layer 503 (including two regions B and C) and the second insulating layer 504 (including two regions C and D) form an angle (the position at which the arrow points), the angle exposes a part of the first insulating layer 502, and a degree θ of the angle is larger than or equal to 90° and is smaller than or equal to 180°. In some implementations, θ is larger than 90° and is smaller than or equal to 180°.

The degree of the formed angle is larger than or equal to 90° and is smaller than or equal to 180°. Therefore, after the supporting layer is subsequently formed, a filling effect of the supporting layer in the region of the angle can be improved, the weak points of the supporting layer can be reduced or eliminated, and further, the problem of generation of holes in the region B and the region D can be improved or eliminated.

After the second insulating layer 404/504 is formed in the manufacturing methods of the foregoing implementations, the subsequent process can be performed according to needs.

Figure 6A:
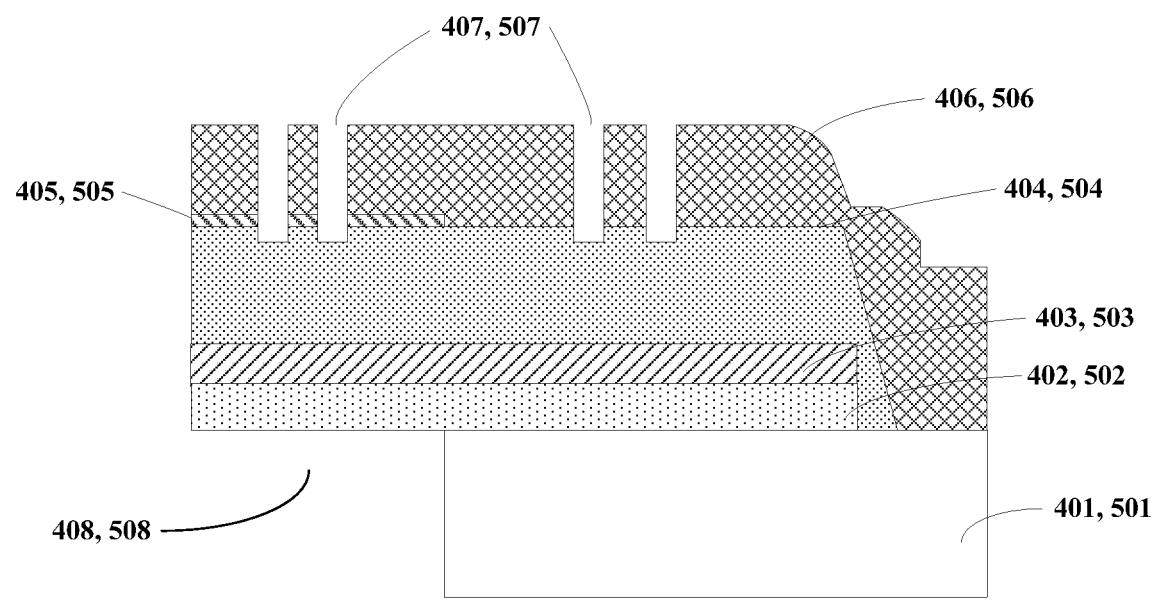
FIG. 6A to FIG. 6B are sectional schematic views of different stages of a method for manufacturing a microphone according to some forms of the present disclosure.

As shown in FIG. 6A, the second electrode plate layer 405/505, for example, polycrystalline silicon, is formed on the second insulating layer 404/504; and then the supporting layer 406/506, for example, silicon oxides, is deposited. Here, the deposited supporting layer 406/506 covers the substrate structure on which the second electrode plate layer 405/505 has been formed, that is, the supporting layer 406/506 is deposited in each of the four regions shown in FIG. 4C/FIG. 5C. The degree of the formed angle is larger than or equal to 90° and is smaller than or equal to 180°. Therefore, after the supporting layer 406/506 is formed, a filling effect of the supporting layer 406/506 in the region of the angle can be improved, the weak points of the supporting layer can be reduced or eliminated, and further, the problem of generation of holes in the region B and the region D can be improved or eliminated.

Afterwards, a first through hole 407/507 penetrating the supporting layer 406/506 and the second electrode plate layer 405/505, and a second through hole 408/508 penetrating the substrate 401/501 can be formed. Refer to FIG. 6A.

Afterwards, a part of the first insulating layer 401/501 and a part of the second insulating layer 402/502 are removed by wet-etching (for example, by using a Buffer Oxide Etching (BOE) solution), so as to form a cavity 409/509 between the first electrode plate layer 403/503 and the second electrode plate layer 405/505.

Figure 6B:
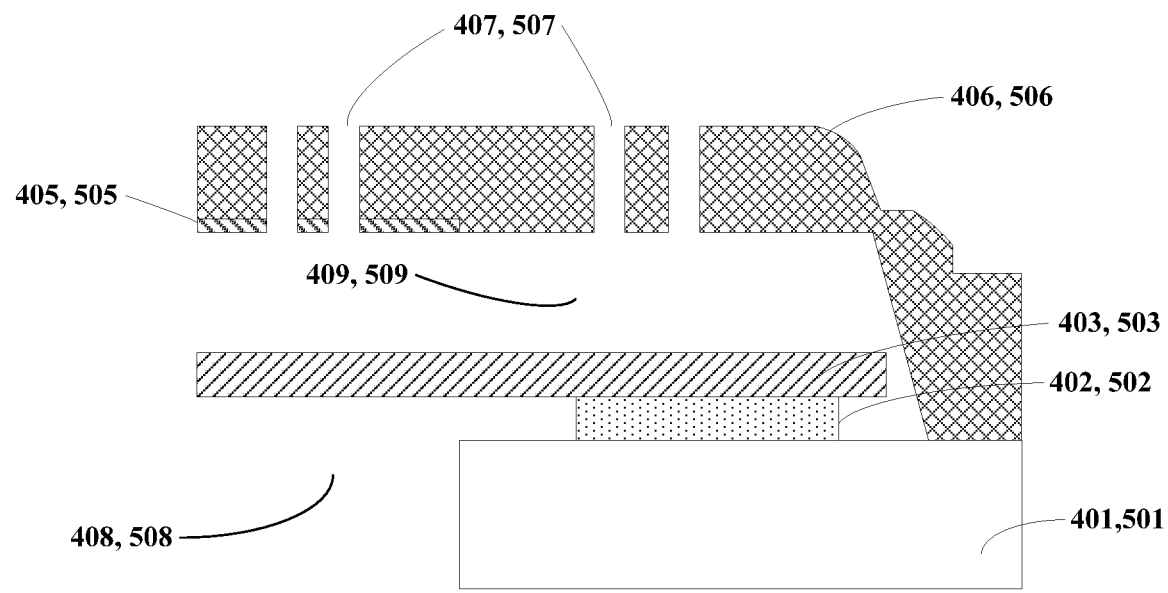

It should be understood that the sectional views shown in the FIG. 6A and FIG. 6B do not show the four regions shown in FIG. 4C and FIG. 5C. However, A person skilled in the art understands that some parts of the microphone, for example, nearby a sound hole (for example, the through hole 408/508), includes the four regions shown in FIG. 4C or FIG. 5C.

This application further provides a microphone. Descriptions are provided with reference to FIG. 6B, FIG. 4C, and FIG. 5C.

In some implementations, referring to FIG. 6B and FIG. 4C, the microphone includes a substrate structure and a supporting layer 406 covering the substrate structure. Here, the substrate structure includes:

the substrate 401 (including four regions A, B, C, and D), the substrate 401 defining the through hole 408 (that is, the second through hole) penetrating the substrate 401;

the first insulating layer 402 (including three regions B, C, and D), covering a part of the substrate 401;

the first electrode plate layer 403 (including two regions B and C), covering the through hole 408 and a part of the first insulating layer 402;

the second insulating layer 404 (including two regions C and D), covering a part of a region of the first insulating layer 402 not covered by the first electrode plate layer 403; and a second electrode plate layer 405, located above the first electrode plate layer 403 and spaced from the first electrode plate layer 403.

When seen from top, referring to FIG. 4C, the first electrode plate layer 403 (including two regions B and C) and the second insulating layer (including two regions C and D) form an angle (the position at which the arrow points), the angle exposes a part of the substrate 401, and a degree θ of the angle is larger than or equal to 90° and is smaller than or equal to 180°. In some implementations, θ is larger than 90° and is smaller than or equal to 180°.

In other implementations, referring to FIG. 6B and FIG. 5C, the microphone includes a substrate structure and a supporting layer 406 covering the substrate structure. Here, the substrate structure includes:

the substrate 501 (including four regions A, B, C, and D and an exposed region of the substrate 501), the substrate 501 defining the through hole 508 (that is, the second through hole) penetrating the substrate 501;

the first insulating layer 502 (including four regions A, B, C, and D), covering a part of the substrate 501;

the first electrode plate layer 503 (including two regions B and C), covering the through hole 508 and a part of the first insulating layer 502;

the second insulating layer 504 (including two regions C and D), covering a part of a region of the first insulating layer 502 not covered by the first electrode plate layer 503; and a second electrode plate layer 505, located above the first electrode plate layer 503 and spaced from the first electrode plate layer 503.

When seen from the top, referring to FIG. 5C, the first electrode plate layer 503 (including two regions B and C) and the second insulating layer (including two regions C and D) form an angle (the position at which the arrow points), the angle exposes a part of the first insulating layer 502, and a degree θ of the angle is larger than or equal to 90° and is smaller than or equal to 180°. In some implementations, θ is larger than 90° and is smaller than or equal to 180°.

Above, microphones and manufacturing methods therefor according to forms of the present disclosure have been described in detail. To avoid obstructing concepts of the present disclosure, some well-known details in the art are not described, but a person skilled in the art will understand how to implement the technical solution disclosed herein according to the foregoing descriptions. In addition, respective embodiments and implementations taught in the disclosure of this specification can be freely combined. It should be understood by a person skilled that the various embodiments can be made to the foregoing described embodiments and implementations without departing from the spirit and the scope of this application limited by the appended claims.

What is claimed is:

1. A method for manufacturing a microphone, comprising:
providing a substrate structure, the substrate structure comprising a substrate and a first insulating layer covering a first part of the substrate;
forming a first electrode plate layer, the first electrode plate layer covering a part of the first insulating layer; and
forming a second insulating layer, the second insulating layer covering a part of a region of the first insulating layer which is not covered by the first electrode plate layer and a part of the first electrode plate layer,
wherein when viewed from the top of the microphone, a border of the first electrode plate layer adjacent to a second part of the substrate not covered by the first insulating layer and a border of the second insulating layer adjacent to the second part of the substrate form an angle, and a degree θ of the angle is larger than or equal to 90° and is smaller than or equal to 180°.

2. The method according to claim 1, wherein θ is larger than 90° and is smaller than or equal to 180°.

3. The method according to claim 1, wherein forming a first electrode plate layer comprises:
depositing a first electrode plate material layer on the substrate structure;
forming a first patterned mask layer on the first electrode plate material layer; and
etching the first electrode plate material layer using the first mask layer as a mask, where the residual first electrode plate material layer serves as the first electrode plate layer.

4. The method according to claim 1, wherein forming a second insulating layer comprises:
depositing a second insulating material layer on the substrate structure on which the first electrode plate layer has been formed;
forming a second patterned mask layer on the second insulating material layer; and
etching the second insulating material layer using the second mask layer as a mask, where the residual second insulating material layer serves as the second insulating layer.

5. The method according to claim 1, further comprising:
forming a second electrode plate layer on the second insulating layer; and
depositing a supporting layer, the supporting layer covering the substrate structure on which the second electrode plate layer has been formed.

6. The method according to claim 5, further comprising:
forming a first through hole penetrating the supporting layer and the second electrode plate layer and a second through hole penetrating the substrate; and
removing a part of the first insulating layer and a part of the second insulating layer by wet-etching, so as to form a cavity between the first electrode plate layer and the second electrode plate layer.

7. The method according to claim 5, wherein
materials of the first electrode plate layer and the second electrode plate layer comprise polycrystalline silicon;
materials of the first insulating layer and the second insulating layer comprise silicon oxides; and
a material of the supporting layer comprises silicon nitrides.

8. A microphone, comprising:
a substrate structure, comprising:
    a substrate defining a through hole penetrating the substrate;
    a first insulating layer covering a first part of the substrate;
    a first electrode plate layer covering the through hole and a part of the first insulating layer;
    a second insulating layer, covering a part of a region of the first insulating layer which is not covered by the first electrode plate layer, wherein when seen from the top of the microphone, a border of the first electrode plate layer adjacent to a second part of the substrate not covered by the first insulating layer and a border of the second insulating layer adjacent to the second part of the substrate form an angle, and a degree θ of the angle is larger than or equal to 90° and is smaller than or equal to 180°; and
    a second electrode plate layer, located above the first electrode plate layer; and
a supporting layer, covering the substrate structure.

9. The microphone according to claim 8, wherein θ is larger than 90° and is smaller than or equal to 180°.

10. The microphone according to claim 8, wherein:
materials of the first electrode plate layer and the second electrode plate layer comprise polycrystalline silicon;
materials of the first insulating layer and the second insulating layer comprise silicon oxides; and
a material of the supporting layer comprises silicon nitrides.

11. A method for manufacturing a microphone, comprising:
providing a substrate structure, the substrate structure comprising a substrate and a first insulating layer covering a part of the substrate;
forming a first electrode plate layer, the first electrode plate layer covering a first part of the first insulating layer; and
forming a second insulating layer, the second insulating layer covering a part of a region of the first insulating layer which is not covered by the first electrode plate layer and a part of the first electrode plate layer, wherein when seen from the top of the microphone, a border of the first electrode plate layer adjacent to a second part of the first insulating layer not covered by the first electrode plate layer or the second insulating layer and a border of the second insulating layer adjacent to the second part of the first insulating layer form an angle, and a degree θ of the angle is larger than or equal to 90° and is smaller than or equal to 180°.

12. A microphone, comprising:
a substrate structure, comprising:
  a substrate defining a through hole penetrating the substrate;
  a first insulating layer covering a part of the substrate;
  a first electrode plate layer covering the through hole and a first part of the first insulating layer;
  a second insulating layer, covering a part of a region of the first insulating layer which is not covered by the first electrode plate layer, wherein when seen from the top of the microphone, a border of the first electrode plate layer adjacent to a second part of the first insulating layer not covered by the first electrode plate layer or the second insulating layer and a border of the second insulating layer adjacent to the second part of the first insulating layer form an angle, and a degree θ of the angle is larger than or equal to 90° and is smaller than or equal to 180°; and
  a second electrode plate layer located above the first electrode plate layer; and
a supporting layer, covering the substrate structure.

* * * * *